United States Patent [19]

Dooley et al.

[11] Patent Number: 4,721,665

[45] Date of Patent: Jan. 26, 1988

[54] METHOD FOR NEUTRALIZING ACIDIC NOVOLAK RESIN IN A LITHOGRAPHIC COATING COMPOSITION

[75] Inventors: Thomas Dooley, Teaneck, N.J.; James Shelnut, Carmel, N.Y.

[73] Assignee: Polychrome Corporation, Yonkers, N.Y.

[21] Appl. No.: 912,866

[22] Filed: Sep. 29, 1986

[51] Int. Cl.$^4$ .................. G03C 1/495; G03C 1/52
[52] U.S. Cl. ........................... 430/169; 430/176; 430/192; 430/270; 430/906; 430/905; 430/168; 430/191; 430/327; 528/492; 528/488; 528/489
[58] Field of Search .............. 528/492, 488, 489; 430/176, 192, 197, 327, 270, 906, 905, 168, 169, 191

[56] References Cited

- U.S. PATENT DOCUMENTS

| | | | |
|---|---|---|---|
| 1,868,079 | 7/1932 | Seebach | 528/492 |
| 4,196,003 | 4/1980 | Watanabe | 430/192 X |
| 4,348,471 | 9/1982 | Shelnut et al. | 430/165 |
| 4,350,753 | 9/1982 | Shelnut et al. | 430/165 X |
| 4,513,077 | 4/1985 | Isobe et al. | 430/270 |

FOREIGN PATENT DOCUMENTS

| | | | |
|---|---|---|---|
| 0002105 | 5/1979 | European Pat. Off. | 430/169 |
| 0158440 | 8/1985 | Japan | 430/270 |
| 1347759 | 2/1974 | United Kingdom | 430/176 |

*Primary Examiner*—Paul R. Michl
*Assistant Examiner*—Cynthia Hamilton

[57] ABSTRACT

The invention features a lithographic composition fabricated from a process wherein an acidic novolak resin is neutralized in solution. The solution comprises a common compatible solvent with the other ingredients of the coating composition, such as a positive sensitizer, a color changing dye, and a light activated, acid-releasing compound.

9 Claims, No Drawings

METHOD FOR NEUTRALIZING ACIDIC NOVOLAK RESIN IN A LITHOGRAPHIC COATING COMPOSITION

This invention relates to an improved process and composition for manufacturing lithographic plates. More particularly, the present invention pertains to a method of preparing a lithographic plate coating composition wherein one of its major components, an aqueous alkali-soluble novolak resin, is rendered substantially acid-free in situ, i.e. during formulation of the coating composition.

BACKGROUND OF THE INVENTION

A colored, positive acting, radiation-sensitive composition for coating lithographic plates is described in U.S. Pat. No. 4,350,753, which issued Sept. 21, 1982. The composition disclosed therein is an admixture of several compounds, including (1) at least one acid-free, aqueous alkali-soluble resin; (2) at least one radiation-sensitive component which upon irradiation yields acidic and/or free radical products; (3) at least one acid and/or radical-sensitive dyestuff which upon contact with the above radiation-sensitive component is rendered colorless less intensely colored, or changed in color; and (4) at least one positive-acting component.

Examples of the above components and the processes for making the same are extensively described in U.S. Pat. No. 4,350,753; columns 3, 4 and 5 of which are incorporated herein by reference.

In this patent, there is a disclosure of the preferred use of "novolak resins", which for the purpose of definition shall be herein defined as the low molecular weight condensation products of mono- or polyhydroxy aryl compounds with aldehydes and ketones. A commercial example of a suitable novolak resin is Alnoval PN 430, manufactured by Hoechst.

In the commercial preparation of novolak resins, and particularly the Alnoval PN 430 the product contains free acid, which when used in lithographic coating compositions decreased the contrast between the exposed and unexposed areas of the lithographic plate. It was desirable, if not necessary, to neutralize these resins such that they became substantially acid-free before introduction into the radiation-sensitive or photosensitive composition. This has been accomplished previously by initially treating a propanol solution of the novolak resin with a base and then precipitating the base-treated novolak resin from a cold dilute solution of sodium chloride. The precipitated novolak resin is then dried and stored for future use.

One of the disadvantages associated with the foregoing neutralization process was the enormous increase in the cost of producing the novolak, which was raised at least five-fold by the separate neutralization treatment and recovery steps. In addition to the increase in production costs there is also the problem of disposing of the waste products obtained from the neutralization treatment.

In accordance with the present invention, it how has been discovered that the novolak resin can be effectively neutralized in situ, i.e., the resin can be alkali treated in solution during the formulation of the lithographic plate coating composition without encountering untoward effects.

The novolak resin is dissolved in a solvent that is common to the other coating composition components: the positive sensitizer, the color changing dye, and the light activated acid-releasing compound. A common solvent for this purpose is n-amyl acetate, and for most purposes the novolak resin is dissolved in the n-amyl acetate solution by slowly adding the novolak resin to the n-amyl acetate solution while stirring. The novolak resin is then neutralized by adding a solution containing both triethylamine and n-amyl acetate. The mix is stirred for 30 minutes to complete the neutralization. The alkali-treated novolak resin is then capable of being directly mixed with the other components of the lithographic composition.

BRIEF SUMMARY OF THE INVENTION

The invention pertains to a method of preparing a lithographic coating composition wherein an aqueous alkali-soluble resin is rendered substantially acid-free in situ. The acidic resin is neutralized in a solution that is a compatible solvent for the other components of the lithographic coating composition: a positive sensitizer, a color changing dye and a light activated compound. The preferred alkali-soluble resin of this invention is a novolak resin, as previously defined. The common solvent comprises n-amyl acetate, and the neutralizing substance comprises at least one organic or heterocyclic tertiary amine, which is preferably triethylamine. The coating composition may also contain polyurethane.

In carrying out the present invention, the use of an alkyl ester as the common solvent has been found to be particularly useful. An especially preferred common solvent is n-amyl acetate, but it will be understood that the alkyl group may be straight or branched chain and contain from 1 to 10 carbon, preferably from 4 to 6 carbon atoms. The carboxyl group may be an acetate, propionate, butyrate, pentylate, etc. The solvent solution may also contain ketones, amides, as well as polyethers and esters thereof such as Methyl Cellosolve TM and methyl cellosolve acetate.

It was further found that the preferred neutralizing agent is a tertiary amine such as triethylamine. Other aliphatic as well as cycloaliphatic and heterocyclic tertiary amines can also be utilized. In addition to the triethylamine other suitable amine neutralizing agents include N, N-diethyl amine, aniline, pyridine, N-methyl pyrollidine, alkyl amines, aryl amines, and the like.

The radiation-sensitive components which upon irradiation yield acidic and/or free radical products are known in the art and include the haloalkylated-s triazines such as are described in U.S. Pat. Nos. 3,954,475, issued May 4, 1976; 4,189,323, issued Feb. 19, 1980 and 4,239,850, issued on Dec. 16, 1980. A preferred haloalkylated-s-triazines is selected from the group consisting of 2-(p-methoxyphenyl)-4, 6-bis (trichloromethyl)-s-triazine and 2-(4-methoxynaphth-1-yl)-4, 6-bis (trichloromethyl)-s-triazine.

The dyestuff may be selected from those known in the art which upon exposure to acidic and/or free radical substances become either colorless or much lighter than their basic and/or reduced forms such as, basic dyes, phthaleins, leuco dyes and the like and mixtures thereof. In general, the acid-sensitive dye-stuff is selected from the group consisting of azo, azine, anthraquinone and triphenylmethyl dyes.

The above dyestuffs may be exemplified by Calco TM Oil Blue RA (American Cyanamid Corp.), malachite green, naphthol yellow, Brilliant green, Bromcresol green, 4-Nitrophenol, Bromcreson purple, Crystal violet, Alizarin red S, Quinaldine red, Alizarin red S, Methyl green, Chlorophenol red, Eosin Y, Nitazine yellow, Methyl violet, Bromothymol blue, m-Cresol purple, Brilliant yellow, Thymol blue, Rosolic acid, Xylenol blue, Phenol red, Eosin B, 3-Nitrophenol, Cresol Red, Orange II, Phloxine B, Phenolphthalein, Bromophenol Blue, o-Cresolphenolphthalein, Bromochlorophenol Blue, Thymolphthalein and the like and mixtures thereof. A preferred acid-sensitive dyestuff is Bromophenol Blue.

The positive-acting radiation-sensitive components usable in connection with the instant invention are those known to the art including diazo oxides such as, aromatic or heterocyclic esters of amides of naphthoquinone-diazide sulfonic or carboxylic acids, for instance those that are described, e.g., by Kosar ("Light Sensitive Systems", John Wiley & Sons, N.Y., 1965), in U.S. Pat. No. 3,785,285 and in Canadian Pat. No. 602,980. A preferred diazo oxide is the ester of 1,2 naphthoquinone-2-diazide-5-sulfonic acid with the product prepared by the condensation of pyrogallol with acetone.

Another type of positive acting components which are usable in accordance with this invention are those polymers which are essentially insensitive to water of aqueous alkali but are rendered soluble or dispersible in such solution upon contact with the free radicals and/or acidic products generated upon irradiation of the composition.

Such polymers are known in the art and include polymers containing at least one ortho-carboxylic acid ester- and/or carboxylic acid amideacetal grouping, the compounds may have a polymeric character and the groupings may be present as connecting elements in the main chain or as lateral substituents and the like, such as are described, e.g., in Ger. Offen. No. 2,610,842 polymeric compounds containing recurrent acetal and/or ketal groupings in which both carbon atoms, in the position of the alcohols required for forming the groupings are aliphatic, and arylalkyl acetals and animals such as are described in, e.g. Ger. Ausleg. No. 2,306,248.

The coating composition prepared hereunder will comprise the following:

| Component | % by Weight |
| --- | --- |
| (a) Novolak resin | 24 to 75 |
| (b) Haloalkyl-s-triazine | 0.5 to 10 |
| (c) Dyestuff | 0.2 to 10 |
| (d) Positive acting diazo oxide | 24 to 75 |

As indicated above, the coating composition may contain other resins such as polyurethane, epoxy resin, acrylic resins and mixtures thereof. The composition may also contain such additives as ether acid-free and alkali soluble resins and other colorants.

The support may be chosen from any known support materials including aluminum and its alloys, metal coated paper and plastic foils and the like. For production of lithographic printing plates, the support preferably comprises aluminum or its lithographically suitable alloy. The composition may be applied to the support from the solution by any means known in the art including whirl coating, meniscus coating and the like.

DETAIL DESCRIPTION OF THE INVENTION

In general, the invention features rendering an aqueous, alkali-soluble resin substantially acid-free in solution, which solution comprises a common or compatible solvent with the other components of a lithographic composition, such as a positive sensitizer, a color changing dye and a light-activated, acid-releasing compound.

The especially preferred alkali soluble resin of the invention is a novolak resin manufactured by Hoechst and sold under the trademark Alnoval AN 430. This commercially available novolak resin is neutralized in solution as illustrated below in accordance with certain preferred embodiments of the invention.

EXAMPLE

To 48 parts n-amyl acetate, 48 parts of methyl isobutyl ketone, 32 parts of methyl ethyl ketone and 32 parts of ethyl Cellosolve is added 6.2 parts of Alnoval PN 430, until dissolved. Triethylamine is directly added in 0.17 parts to effect neutralization. The remaining ingredients are then added as follows: a positive diazo sensitizer—3.3 parts; polyurethane—0.2 parts; Bromophenol Blue—0.18 parts; and a light-activated, acid-releasing compound (Triazine S)—0.2 parts.

The resulting solution was used to coat a sheet of aluminum alloy AA1100 that had been mechanically grained and then anodized in an aqueous electrolyte as described in U.S. Pat. No. 4,350,753. After evaporation of the solvents, the thus coated plate was imagewise exposed to UV radiation through a positive flat, using a 5KW metal halide radiation source at a distance of 36 inches for one minute. The resultant plate exhibited an unexpectedly high color contrast between the exposed and unexposed areas thereof.

It will be understood that the above embodiment is illustrative only and that the invention is subject to variations and modifications without departing from its broader aspects. Thus, for some purposes it may be preferred to effect neutralization separately formulating, with stirring, n-amyl acetate solutions of the Alnoval PN 430 and the triethylamine. The latter is then slowly added to the n-amyl acetate solution of Alnoval PN 430, and the resulting admixture stirred for about 30 minutes or longer.

What is claimed is:

1. A method of preparing a lithographic coating composition wherein an aqueous alkali-soluble novolak resin is rendered substantially acid-free in situ, comprising the steps of:
   (a) neutralizing an acidic novolak resin in solution to render said acidic resin substantially acid-free; and
   (b) directly forming an admixture of said neutralized resin solution with a positive acting, radiation sensitive diazo oxide, a color changing dye which upon exposure to acidic or free radical substances becomes colorless or lighter, and a light activated acid-releasing compound.

2. The method of claim 1, wherein said novolak is rendered substantially acid-free while dissolved in a solution comprising n-amyl acetate, which solution is a solvent for said positive sensitizer, said dye and said acid-releasing compound.

3. The method of claim 2, wherein said novolak is neutralized in said n-amyl acetate solution by addition of a solution comprising at least one aliphatic cyclo aliphatic or heterocyclic tertiary amine.

4. The method of claim 3, wherein said tertiary amine is triethylamine.

5. The method of claim 1, wherein said admixture also contains polyurethane.

6. A method of preparing a lithographic coating composition wherein an aqueous alkali-soluble resin is rendered substantially acid-free in situ, comprising the steps of:
(a) forming a solution of at least one novolak resin with a solvent compatible with other compounds of said lithographic composition;
(b) neutralizing said solution with a tertiary amine to render said novolak-containing solution substantially acid-free; and
(c) directly forming an admixture of said neutralized solution with a positive acting, radiation sensitive diazo oxide, a color changing dye which upon exposure to acidic or free radical substances becomes colorless or lighter, and a light activated acid-releasing compound.

7. The method of claim 6, wherein said tertiary amine is triethylamine.

8. The method of claim 6, wherein said compatible solvent comprises n-amyl acetate.

9. The method of claim 6, wherein said admixture also contains polyurethane.

* * * * *